United States Patent [19]

Scholz et al.

[11] Patent Number: 4,489,439

[45] Date of Patent: Dec. 18, 1984

[54] ELECTRONIC STEREO REVERBERATION DEVICE WITH DOUBLER

[75] Inventors: Donald T. Scholz, Wayland; Neil A. Miller, Newtonville, both of Mass.

[73] Assignee: Scholz Research & Development, Waltham, Mass.

[21] Appl. No.: 420,282

[22] Filed: Sep. 20, 1982

[51] Int. Cl.[3] .......... H03G 3/00

[52] U.S. Cl. .......... 381/63; 381/17

[58] Field of Search .......... 381/61, 17, 62, 18, 381/63, 94, 56; 84/DIG. 26

[56] References Cited

U.S. PATENT DOCUMENTS

| | | | |
|---|---|---|---|
| 3,126,449 | 3/1964 | Shirman | 381/94 |
| 3,749,837 | 7/1973 | Doughty | 381/62 |
| 3,881,057 | 4/1975 | Adachi et al. | 381/63 |
| 4,164,884 | 8/1979 | Kakghashi | 381/63 X |
| 4,184,047 | 1/1980 | Langford | 381/63 |
| 4,215,242 | 7/1980 | Gross | 381/63 |
| 4,268,717 | 5/1981 | Moore | 381/63 |

*Primary Examiner*—Keith E. George

*Attorney, Agent, or Firm*—Wolf, Greenfield & Sacks

[57] ABSTRACT

A stereo or two channel electronic reverberation device is disclosed comprising an analog delay device which receives audio signals and provides delayed output signals at a plurality of outputs, with the time delay period of each output being different from the delay period of other outputs. Two summing devices each receive inputs from different combinations of the analog delay device outputs to provide two different signals having different reverb components. An additional output delay device is also provided with receives the last output from the analog delay device, delays this signal a time period substantially greater than the time period between any two adjacent analog delay device outputs, and provides this substantially greater delayed signal to only one of said summing devices. The circuit includes a synthetic doubler which provides an output cyclicly varying in pitch from its input. Two output mixers provide reverb alone, doubler signal alone or both reverb and doubling. A timed turn on gate at the input of the analog delay device substantially eliminates unwanted noise signals of short duration.

20 Claims, 4 Drawing Figures

ELECTRONIC STEREO REVERBERATION DEVICE WITH DOUBLER

TECHNICAL FIELD

This invention is directed to devices which alter electrical audio signals, and more particularly to devices for introducing reverberation into such signals.

BACKGROUND OF THE INVENTION

There are many prior art devices that are available for electrically introducing reverberation effects into audio output signals. Many of these devices are susceptible to mechanical jarring, and produce "Boing" type sounds when subject to such jarring or mechanical vibration or are electrically noisy. At least one prior art reverb unit incorporates a multiple output bucket brigade device, i.e. analog shift register. However, for certain applications this device does not provide sufficient reverberation effects to the inputted signal, and is limited in the type and quality of the reverb that it provides.

SUMMARY OF THE INVENTION

An object of the invention is to add reverberation to the electrical audio signals so that the resultant signal has superior reverberation characteristics.

In accordance with one form of the invention for providing reverberation, a timed turn on gate receives a main audio signal and gates this signal to an analog shift register only after this signal exceeds a certain signal level for a certain time period. The analog shift register provides delayed output signals at a plurality of staggered delay taps Two summing devices each receive output signals from different combinations of delay taps, and sum the signals respectively inputted thereto to provide two different output signals having different reverb characteristics or delay components. Also, by providing a timed turn on gate in front of the analog shift register, much unwanted noise of short duration is removed and therefore an output signal having high quality reverberation is obtained.

In another form of the invention for providing reverberation to an electrical audio signal, an analog shift register receives a main audio signal and provides delayed outputs at a plurality of staggered delay taps. An output delay circuit receives an output signal from one of the staggered delayed taps, preferably the last in the series, and delays the received signal a time period substantially different from the delay time period between any two of the adjacent staggered delay taps. Two summing devices receive output signals from different combinations of the delay taps, and one of the summing devices receives the output from the output delay circuit. By summing the signals inputted thereto, the summing devices provide two different channels of audio output signals having different delay components. The output delay circuit following the analog shift register provides additional reverberation components to the resultant output signal, which is different from the sound obtained by using a single analog shift register.

Numerous other advantages and features of the present invention will become readily apparent from the following detailed description of the invention and one embodiment thereof, from the claims and from the accompanying drawings.

DETAILED DESCRIPTION OF THE PREFERRED EMBODIMENT

Figure 1:
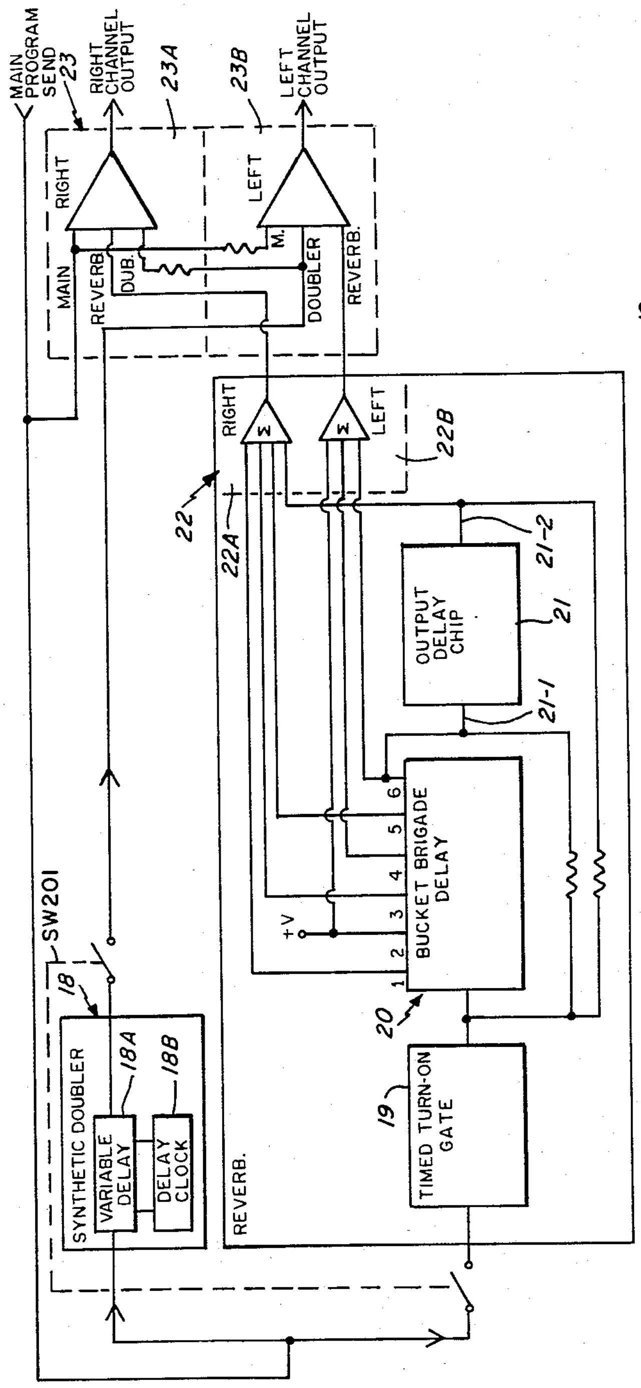
FIG. 1 is an overall block diagram of the electronic reverberation device according to the invention.

While this invention is susceptible of embodiment in many different forms, there is shown in the drawings and will herein be described in detail one specific embodiment with the understanding that the present disclosure is to be considered as an exemplification of the principles of the invention and is not intended to limit the invention to the embodiment illustrated.

Referring to FIG. 1, a reverberation device in accordance with the invention comprises a doubling circuit 18, a timed turn on gate 19, a bucket brigade device 20 with delay taps and including its associated input buffer amp and filter circuit, an output delay circuit 21, an output summing and amplifier circuit 22, and an output amplifier and mixing circuit 23. The device operates in one of three modes to provide doubling alone, reverb alone, or both doubling and reverb, as controlled by switch SW 201.

Figure 2:
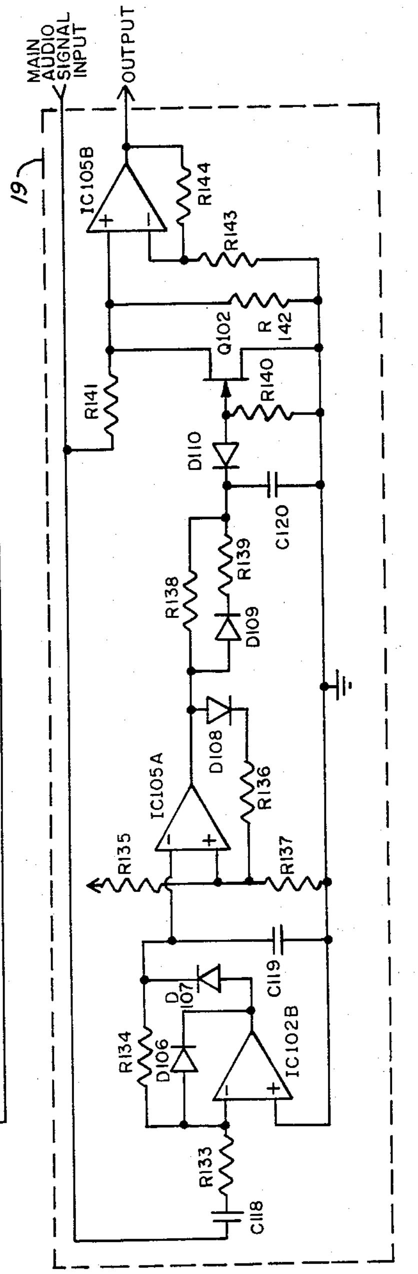
FIG. 2 is an electrical schematic diagram of the timed turn on gate of FIG. 1.

Turning now to FIG. 2, the operation of the timed turn on gate 19 will now be described. The timed turn on gate 19 receives a main audio signal which is fed into amplifier IC 102B. Amplifier IC 102B, in conjunction with amplifier IC 105A and associated resistors R 133 through R 140, capacitors C 118 through C 120 and diodes D 106 through D 110, will effect switching of FET transitor Q 102 (to gate the main audio signal to IC 105B) 40 milliseconds after a main audio signal of sufficient magnitude is present on the main signal line. The main audio signal that is gated comes through resistor R 141.

When the input signal is low the resistance across the FET will be low and the signal will be attenuated to a very low amount, essentially off. When the signal to the FET is high, the FET will turn on and open its gate to let the main audio signal pass virtually unattenuated as long as a certain amount of voltage is maintained at the gate of the FET. The value of capacitor C 120, in conjunction with resistor R 138, determines the turn on time which is about 40 milliseconds. As soon as a signal of sufficient magnitude appears at the input of IC 102B, the signal at the output of IC 102B begins charging capacitor C 120. When C 120 is charged to a sufficient amount, the signal is passed to IC 105A. Therefore, adequate turn on voltage does not get to the FET gate until 40 milliseconds after the signal is present at the input of op amp IC 102B.

Capacitor C 120, in conjunction with R 139, sets the release time of the timed turn on gate which is a few milliseconds. Thus, if the signal voltage suddenly drops, the voltage across the capacitor C 120 will not disappear immediately, but will bleed off gradually through resistor R 139. Therefore, the FET will not clamp down shut suddenly but instead will slowly turn off so that the sound into the reverb does not end abruptly.

By providing a timed turn on gate some unwanted noise spikes of short duration, e.g. a few milliseconds, are prevented from being reverberated. Another benefit of the turn on gate is that very loud attack portions of certain musical signals are prevented from entering and overloading the reverberator.

Without a timed turn on gate according to the invention, the spikes would pass to the main reverb unit and would result in numerous discrete echoes. One way to reduce the effect of spikes might be to provide a large number of delay taps, i.e. about 100 taps. However, this would be quite costly. Therefore, by providing a timed turn on gate according to the invention, spikes will be eliminated even in reverb units having a small number of stages. If a note is played and then another note is played immediately thereafter, the gate is already opened so a spike would get through, but the spike would not be noticed because program material would mask it.

The doubling circuit 18 essentially functions to simulate a second instrument which is slightly off key and slightly out of time with an initial instrument. This is done by cyclicly varying the pitch of the initial instrument signal back and fourth about its nominal pitch. For example, if the nominal pitch of the initial instrument signal is an F note then the doubler will output a sharp F note for a while and then a flat F note for a while followed by a sharp F note again and so on.

Cyclic pitch variation can be achieved by inputting the initial instrument signal into an analog delay device and then varying the clock frequency of the clock which drives the delay device. If the analog delay device is a bucket brigade, the bucket brigade receives an initial instrument signal and shifts the signal within the brigade from bucket to bucket at speed determined by the frequency of the clock which drives the bucket brigade. By varying the frequency of the clock signal the pitch of the signals passed by the buckets can be varied. By reducing the clock frequency the pitch will lower. To hold the pitch at the reduced pitch level, one must keep reducing the clock speed at the same rate of change. However if this is continued the resultant delay of the bucket brigade will be delayed further and further until eventually the output would be minutes behind its input. In order to provide a pitch differential while still keeping the overall delay to about 15 to 20 milliseconds, the pitch is increased and then reduced and so on in a cyclical manner. Of course the delay will vary within the range of about 15 to 20 milliseconds.

The doubling circuit 18 comprises essentially two circuit portions: an analog delay portion 18A and a delay clock portion 18B.

Figure 3:
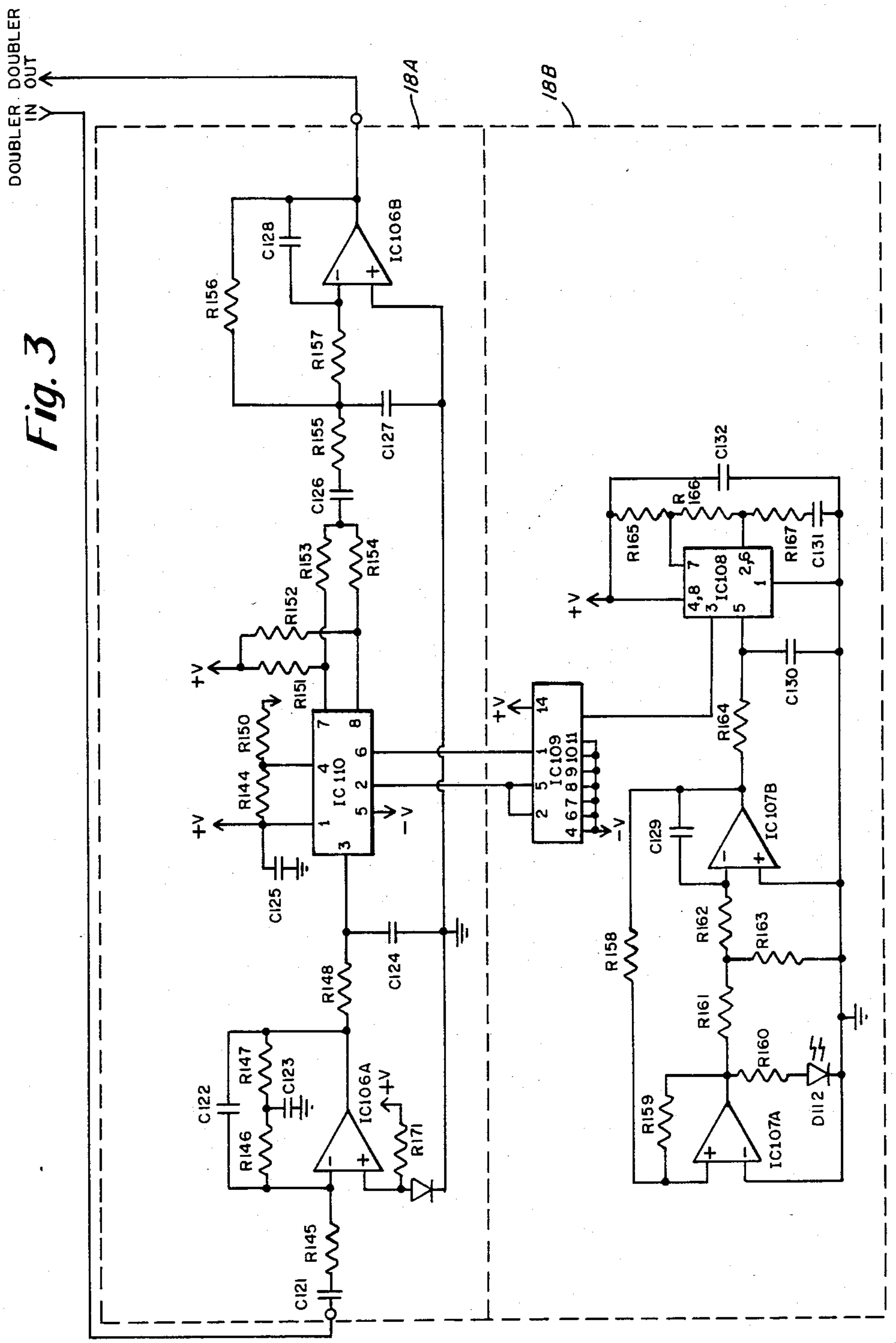
FIG. 3 is an electrical schematic diagram of the synthetic doubling circuit stage of FIG. 1.

The analog delay portion 18A (See FIG. 3 also) comprises a bucket brigade device IC 110 which has an input buffer amp IC 106A, and an output buffer amp IC 106B, each having associated resistors and capacitors as shown. The bucket brigade IC 110 at its pins 2 and 6 receives a series of clock pulses of opposite phase from IC 109. IC 108 and 109 create a high frequency clock whose frequency varies about a nominal rate.

In order to create a slow variation in this clock rate, a low frequency oscillator comprising IC 107 A and B, along with associated resistors and capacitors, provides a triangle waveform signal of frequency about 0.5 $H_2$ to pin 3 of IC 109. In response to this triangle wave form, IC 108 and 109 will produce clock pulses of slowly varying frequency. The bucket brigade will respond to these clock pulses to cyclicly vary the pitch of its output signal to either side of the pitch of its input signal. The output of the doubling circuit will thus simulate a second instrument slightly off key and out of time with an instrument whose signal is inputted to the doubling circuit.

Figure 4:
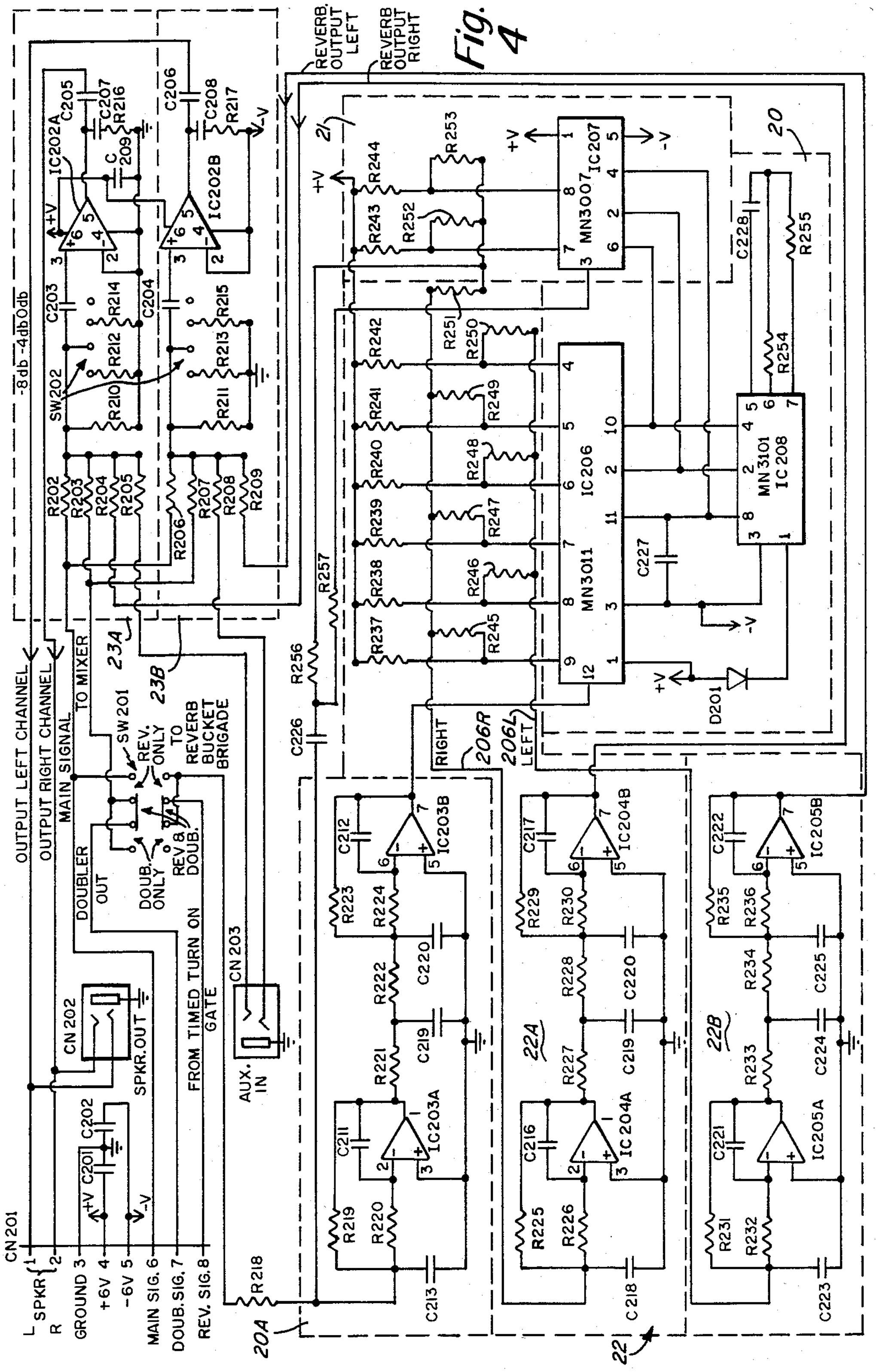
FIG. 4 is an electric schematic diagram of the the analog shift register or bucket brigade stage, the delay output circuit, and the output amplifiers and mixers of FIG. 1.

As shown in FIG. 4, the output from the timed turn on gate 19 and the doubling circuit 18 is provided to terminals of switch SW 201. Switch 201 is an eight terminal three position slide switch having an upper sliding member which engages two adjacent terminals at a time, and a lower sliding member which also engages two terminals at a time and moves in conjunction with the upper sliding member. The sliding members are moved by manual switch actuating element. When the switch actuator is on the extreme left, the reverberation portion of the preferred embodiment provides a doubling output but no reverb output to the output mixers. When the switch actuator is in the middle position, the reverberation portion of the preferred embodiment will provide both a doubling component and a reverberation component to the output mixers. When the switch actuator is on the extreme right, the circuit will provide a reverberation signal but no doubling component to the output mixers.

As shown in FIG. 1, the reverberation unit comprises a bucket brigade delay device (an analog delay device) 20 which receives an input signal from a musical instrument or the like at the left as shown in the figure. The bucket brigade device has 6 output taps labeled 1 through 6 in FIG. 1. A signal appearing at the input 20-1 of the bucket brigade will appear at the first output delay tap about 20 milliseconds after it is inputted. The delay between adjacent taps is unequal. For example, the inputted signal will apear at the second output delay tap about 12 milliseconds after it appears at the first output, which is about 32 milliseconds after it appears at the input 20-1. The inputted signal will appear at delay taps 3-6 in sequence with irregular delays between each tap. Finally, the signal will appear at the output of the last delay tap about 150 milliseconds after it is inputted on the 20-1.

The output of the last delay tap is inputted to an output delay circuit 21 at an input line 21-1. The output delay circuit will produce the inputted signal to its output 21-2 about 50 milliseconds after it appears at its input 21-1.

The outputs of the bucket brigade are connected to a summing circuit 22 comprising right and left summers 22A and 22B, respectively. Right summer receives alternate outputs from the bucket brigade 20, i.e. delay taps 1, 3 and 5, while the left summer receives different alternate outputs from the bucket brigade 20, i.e. delay taps 2, 4 and 6. The right summer will also receive the output from the output delay circuit 21. However, this output at line 20-1 from output delay circuit 21 will not be provided to the left summer. In this manner, not only will the right summer receive different combinations of outputs from bucket brigade 20 than the right summer, but the left summer will receive an additional delay output, i.e. the output from output delay circuit 21. Therefore, the outputs 22-1 and 22-2 of the summers 22A and 22B will have different delay components. The result of adding these two separate groups of irregularly spaced delay components is to create two highly complex frequency responses, with many peaks and valleys which are not correlated to each other. When these two different signals are fed to separate sound transducers or a stereo amplifier and speaker system for e.g., the sounds produced by the two summers will create a stereo image.

Referring again to FIG. 4, when switch 201 is in either the middle or extreme right position, the bucket brigade circuit 20 will receive a signal at the input of its buffer amplifier and filter circuit portion 20A. The buffer amplifier and filter circuit portion comprises two integrated circuits IC 203A and IC 203B, and associated resistors and capacitors, and provides an amplified and filtered signal to pin 12 of the bucket brigade device IC 206. The integrated circuit IC 206 is an analog shift register having 6 output delay taps at pins 4–9 thereof.

Integrated circuit IC 208 is an analog shift register clock generator/driver which drives both integrated circuits IC 206 and IC 207. The period of the switching of the timer is dependent upon the circuit values of resistors R 254, R 255 and capacitor C 228. The bucket brigade IC 206 receives an input signal at pin 12 and provides this signal at different delay periods to the output delay taps (pins 4–9). The delay between adjacent delay taps is irregular, in the range of 10 to 30 milliseconds. A signal is outputted at the last delay tap (pin 4) about 150 milliseconds after it is received at input pin 12 of IC 206. The output of the last delay tap (pin 4) is provided to pin 3 of an additional output delay integrated circuit chip IC 207, which is also an analog shift register like IC 206, but with fewer stages. The IC 207, at pins 7 and 8, provides a delayed output about 50 milliseconds after it receives an input at pin 3.

The output of output delay taps 4–9 of bucket brigade IC 206 and delay taps 7 and 8 of IC 207 are fed into a resistor summing network comprising resistors R 245 through R 251. As seen in FIG. 4, the outputs of alternate pins 4, 6 and 8 are summed on the lower output line 206L (left channel), whereas the outputs of alternate pins 5, 7 and 9 are summed on the upper output line 206R (right channel). Further, the output of the additional output delay chip IC 207 is fed only to the upper output line 206R. The output of the upper output line 206R (right channel) is fed to the input of a right output amplifier and filter comprising integrated circuits IC 204A and IC 204B, associated resistors R 225 through R 230, and capacitors C 216 through C 220. The output of this right output amplifier and filter appearing at pin 7 of IC 204B is connected to a resistor R 204 at the input of output amplifier and mixing circuit 23.

Similarly, the output line 206L of the lower line of summing resistors (left channel) is fed to the left output amplifier and filter circuit comprising IC 205A and IC 205B, associated resistors R 231 through R 236, and capacitors C 221 through C 225. The output of the left output amplifier and filter circuit appears at pin 7 of IC 205B and is connected to resistor R 209 at the input of output amplifier and mixing circuit 23.

The output amplifier and mixing circuit 23 comprises essentially two different, but substantially identical, output amplifier and mixing circuits 23A and 23B. The upper output amplifier and mixing circuit 23A comprises four input summing resistors R 202 through R 205 and an amplifier mixer IC 202A. In like manner, the lower output amplifier and mixing circuit 23B comprises four input summing resistors R 206 through R 209 and an amplifier mixer IC 202B.

The main signal from the controlled distortion and tone alteration portion of the circuit always appears at the left side of input summing resistors R 202 and R 206. When switch SW 201 is in the middle or right position, reverberation signals will appear at the left side of input summing resistors R 204 and R 209. A doubling signal will appear at the left side of input summing resistors R 203 and R 207 when switch SW 201 is in either the left or middle position, but not when SW 201 is in the right position. However, when SW 201 is in the right position, the main audio signal will appear at the left side of resistors R 203 and R 207 in place of the doubling circuit signal to compensate for the absence of the doubling circuit signal. In this way, the signal level to each mixer provided by the combination of the main audio signal and the doubler is maintained relatively constant. An auxiliary input signal can be inputted to connector CN 203 if desired and will then appear at the right side of input summing resistors R 205 and R 208.

Switch SW 202 in the output amplifier and mixing circuit 23 provides a means to selectively attenuate the mixed signals in both channels before they pass through amplifiers IC 202A and IC 202B. Switch SW 202 is a three position, eight terminal slide switch substantially identical in structure and operation to switch SW 201. When the switch contacts are in the extreme right position, 0 db attenuation is achieved. When the switch is in the middle position, 4 db attenuation is obtained, and when the switch is in the left position 8 db of attenuation is achieved.

The output of output amplifier and mixing circuit 23 provides two separate channels of output signals having different signal characteristics. The signals are provided to connector CN 202 which is a stereo output connector, and to terminals 1 and 2 of connector CN 201, also a stereo output connector. The signals from these two separate channels can be provided to a sound transducer, a stereo amplifier and speaker system, a mixing console or sound recording device.

Table 1 attached hereto lists the values of the circuit components described herein. However, it is to be understood that the invention is not limited to the precise circuit values or even the specific embodiment described above, and no limitation with respect to the specific apparatus illustrated herein is intended or should be inferred. It can be appreciated that numerous variations and modifications may be effected without departing from the true spirit and scope of the novel concept of the invention. It is of course intended to cover by the appended claims all such modifications as fall within the scope of the claims.

TABLE I

| | | | |
|---|---|---|---|
| R 133 | 1 M | R 158 | 27K |
| R 134 | 1 M | R 159 | 39K |
| R 135 | 1 M | R 160 | 220K |
| R 136 | 1 M | R 161 | 120K |
| R 137 | 4.7K | R 162 | 220K |
| R 138 | 1 M | R 163 | 6.8K |
| R 139 | 150K | R 164 | 390 |
| R 140 | 10 M | R 165 | 2.7K |
| R 141 | 120K | R 166 | 560K |
| R 142 | 10K | R 202 | 120K |
| R 143 | 10K | R 203 | 39K |
| R 144 | 120K | R 204 | 390K |
| R 145 | 150K | R 205 | 33K |
| R 146 | 82K | R 206 | 39K |
| R 147 | 82K | R 207 | 120K |
| R 148 | 6.8K | R 208 | 33K |
| R 149 | 22K | R 209 | 330K |
| R 150 | 2.2K | R 210 | 2.2K |
| R 151 | 100K | R 211 | 2.2K |
| R 152 | 100K | R 212 | 1K |
| R 153 | 4.7K | R 213 | 1K |
| R 154 | 4.7K | R 214 | 2.7K |
| R 155 | 56K | R 215 | 2.7K |
| R 156 | 56K | R 216 | 10 |
| R 157 | 27K | R 217 | 10K |

TABLE I-continued

| | | | |
|---|---|---|---|
| R 218 | 100K | R 245 | 100K |
| R 219 | 100K | R 246 | 100K |
| R 220 | 33K | R 247 | 120K |
| R 221 | 47K | R 248 | 120K |
| R 222 | 56K | R 249 | 150K |
| R 223 | 100K | R 250 | 150K |
| R 224 | 33K | R 251 | 150K |
| R 225 | 100K | R 252 | 5.6K |
| R 226 | 33K | R 253 | 5.6K |
| R 227 | 47K | R 254 | 120K |
| R 228 | 56K | R 255 | 22K |
| R 229 | 100K | R 256 | 470K |
| R 230 | 33K | R 257 | 390K |
| R 231 | 100K | C 118 | .01 uf |
| R 232 | 33K | C 119 | .05 uf |
| R 233 | 47K | C 120 | .05 uf |
| R 234 | 56K | C 121 | 3.3 uf |
| R 235 | 100K | C 122 | 62 pf |
| R 236 | 33K | C 123 | 1500 pf |
| R 237 | 56K | C 124 | 2700 pf |
| R 238 | 56K | C 125 | 22 uf |
| R 239 | 56K | C 126 | 3.3 uf |
| R 240 | 56K | C 127 | .0033 uf |
| R 241 | 56K | C 128 | .001 uf |
| R 242 | 56K | C 129 | .115 uf |
| R 243 | 100K | C 130 | .01 uf |
| R 244 | 100K | C 131 | 15 pf |
| C 132 | 3.3 uf | C 226 | 3.3 uf |
| C 201 | 22 uf | C 227 | 3.3 uf |
| C 202 | 22 uf | C 228 | 220 pf |
| C 203 | .1 uf | D 106 - | |
| C 204 | .1 uf | D 111 | IN 9114 |
| C 205 | 220 uf | D 112 | LED |
| C 206 | 220 uf | D 113 | LED ($V_B$ = 2.2) |
| C 207 | .05 uf | D 201 | In 9114 |
| C 208 | .05 uf | IC 102 | TL 072 |
| C 209 | .1 uf | IC 105 | TL 072 |
| C 211 | 220 pf | IC 106 | TL 072 |
| C 212 | 220 pf | IC 107 | TL 072 |
| C 213 | 2700 pf | IC 108 | IC 7555 |
| C 214 | 2700 pf | IC 109 | CD 4013B |
| C 215 | 2700 pf | IC 110 | MN 3007 |
| C 216 | 220 pf | IC 201 | LM 386 |
| C 217 | 220 pf | IC 202 | LM 386 |
| C 218 | 2700 pf | IC 203 | TL 072 |
| C 219 | 2700 pf | IC 204 | TL 072 |
| C 220 | 2700 pf | IC 205 | TL 072 |
| C 221 | 220 pf | IC 206 | MN 3011 |
| C 222 | 220 pf | IC 207 | MN 3007 |
| C 223 | 2700 pf | IC 208 | MN 3101 |
| C 224 | 2700 pf | | |
| C 225 | 2700 pf | | |

What is claimed is:

1. An electronic reverberation device for providing reverberation to signals in the audio frequency range, comprising:

a timed input delay gate for gating to its output only those audio signals inputted thereto which appear longer than a cetain time period;

an analog shift register for receiving the gated output signals from said delay gate and for providing staggered delayed outputs at a plurality of delay taps;

at least two summing devices which receive output signals from different combinations of delay taps from said analog shift register delay and which sum the signals inputted thereto to provide audio output signals having different delay components, said timed input delay gate comprising an input terminal, an output terminal, a charge-discharge circuit, a semiconductor control device, output circuit means, means coupling the input terminal to the charge-discharge circuit, means coupling the charge-discharge circuit to the semiconductor control device, means coupling the semiconductor control device to the output circuit means, means for coupling the audio input signal at the input terminal also to the output circuit means, means coupling the output circuit means to the output terminal, said charge-discharge circuit adapted to provide a time delay during which the semiconductor control device is operated to block the main audio signal at the output circuit means for a predetermined time interval.

2. The electronic reverberation device of claim 1 wherein the delay taps of said analog shift register provide output signals at unequal delay periods.

3. The electronic reverberation device of claim 1 wherein each summing device receives alternate outputs of said analog shift register.

4. The electronic reverberation device of claim 3 further including:

an output delay gate for receiving an output signal from one of said analog shift register delay taps and for delaying said signal a time period substantially different from the delay time period between any two adjacent delay taps;

and wherein only one summing device receives the output of said output delay gate.

5. The electronic reverberation device of claim 4, wherein the time period of the output delay gate is substantially larger than the time period between any two adjacent staggered delay taps.

6. The electronic reverberation device of claim 4 wherein the output delay device receives its input signal from the last output delay tap of said analog delay device.

7. The electronic reverberation device of claim 1 wherein the time period of the timed input delay gate is about 40 milliseconds.

8. The electronic reverberation device of claim 1 further including:

a doubling circuit for receiving the main input audio signal and for providing an output signal whose pitch varies from the pitch of said inputted signal; and two output mixers, each of which receives the output signals from a different summing device and wherein the output mixers also receive the output signals from said doubling circuit and the main audio signal, and wherein the output mixers combine the signals inputted thereto to provide two audio signals having different audio characteristics.

9. An electronic reverberation system for providing reverberation to signals in the audio frequency range, comprising;

a reverberation circuit for receiving a main input audio signal and providing audio output signals having different delay components including at least first and second audio reverberation output signals;

a doubling circuit for receiving the main input audio signal and for providing an output signal whose pitch varies from the pitch of said inputted signal; and two output mixers, each of which respectively receives the first and second audio reverberation output signals and wherein the output mixers also receive the output signals from said doubling circuit and the main input audio signal, and wherein the output mixers combine the signals inputted thereto to provide two audio signals having different audio characteristics.

10. The electronic reverberation system of claim 9 including manual switch means having multiple positions including a first circuit interconnecting position in which the output from the doubling circuit is connected to the mixers and the outputs from the reverberation circuit are disconnected from the mixers.

11. The electronic reverberation system of claim 10 wherein the manual switch means has a second circuit interconnecting position in which the output from the doubling circuit and the outputs from the reverberation circuit are both connected to the mixers.

12. The electronic reverberation system of claim 11 wherein the manual switch means has a third circuit interconnecting position in which the output from the doubling circuit is disconnected from the mixers and the outputs from the reverberation circuit are connected to the mixers.

13. The electronic reverberation system of claim 12 in which said reverberation circuit comprises a timed input delay gate for gating to its output only those audio signals inputted thereto which appear longer than a certain time period, an analog shift register for receiving the gated output signals from said delay gate and for providing staggered delayed outputs at a plurality of delay taps, and at least two summing devices which receive output signals from different combinations of delay taps from said analog shift register delay and which sum the signals inputted thereto to provide audio output signals having different delay components.

14. The electronic reverberation system of claim 13 wherein said manual switch means is slide switch having three positions in which adjacent terminals are successively interconnected.

15. An electronic reverberation device for providing reverberation to signals in the audio frequency range, comprising:

a timed input delay circuit including an input terminal for receiving the audio signal and a gate means for gating from the input terminal to an output terminal thereof, only those audio signals which have a duration longer than a predetermined time interval;

and an analog shift register for receiving the gated output signals from said timed input delay circuit and for providing staggered delayed outputs at a plurality of delayed taps;

and at least two summing devices which receive output signals from different combinations of delayed taps from said analog shift register delay and which sum the signals inputted thereto to provide audio output signals having different delay components.

16. An electronic reverberation device for providing reverberation to signals in the audio frequency range, comprising:

a timed input delay circuit including an input terminal for receiving the audio signal, an output terminal, and a gate means for gating from the input to the output terminal thereof, only those audio signals which have a duration longer than a predetermined time interval;

a delay means for receiving the gated output signals from said timed input delay circuit for providing at least two different delayed output signals;

and an output means which receives the delayed output signals from said delay means and which provides audio output signals having different delay components.

17. An electronic reverberation device as set forth in claim 16 wherein said delay means comprises an analog shift register with the delay taps of said analog shift register providing output signals at unequal delay periods.

18. An electronic reverberation device as set forth in claim 17 wherein said output means comprises a summing device having alternate outputs from said analog shift register.

19. An electronic reverberation device as set forth in claim 18 including an output delay means for receiving an output signal from one of said analog shift register delay taps and for delaying said signal a time period substantially different from the delay time period between any two adjacent delay taps.

20. An electronic reverberation device as set forth in claim 16 wherein the time period of initial interruption of gating associated with the time input delay gate is on the order of 40 milliseconds.

* * * * *